(12) United States Patent
Gao

(10) Patent No.: US 12,029,013 B2
(45) Date of Patent: Jul. 2, 2024

(54) COOLING PLATE WITH COAXIAL FLUID PORT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 77 days.

(21) Appl. No.: 17/469,586

(22) Filed: Sep. 8, 2021

(65) Prior Publication Data
US 2023/0075362 A1    Mar. 9, 2023

(51) Int. Cl.
*H05K 7/20* (2006.01)
*H05K 1/02* (2006.01)

(52) U.S. Cl.
CPC ....... *H05K 7/20318* (2013.01); *H05K 1/0203* (2013.01); *H05K 7/20327* (2013.01); *H05K 7/20509* (2013.01)

(58) Field of Classification Search
CPC ............. H05K 7/0203; H05K 7/20327; H05K 7/20509; H05K 7/20318
See application file for complete search history.

(56) References Cited

U.S. PATENT DOCUMENTS

| | | | | |
|---|---|---|---|---|
| 7,336,487 B1* | 2/2008 | Chrysler | ............... | H01L 23/473 361/679.48 |
| 7,753,108 B2* | 7/2010 | Lai | ....................... | H01L 23/473 165/80.4 |
| 9,345,169 B1* | 5/2016 | Campbell | .......... | H05K 7/20327 |
| 10,160,072 B2* | 12/2018 | Boday | ................ | H05K 7/20254 |
| 10,405,458 B2* | 9/2019 | Fukunaga | ......... | H05K 7/20272 |
| 10,863,651 B2* | 12/2020 | Iyengar | ................ | H05K 5/0208 |
| 2007/0241560 A1* | 10/2007 | Malone | ................. | F16L 37/565 285/123.3 |
| 2016/0120059 A1* | 4/2016 | Shedd | ..................... | F28D 21/00 165/244 |
| 2020/0011620 A1* | 1/2020 | Sherrer | ............... | H01L 23/4735 |
| 2021/0076539 A1* | 3/2021 | Raeth | ................. | H05K 7/20254 |
| 2021/0149461 A1* | 5/2021 | Tung | .................. | H05K 7/20318 |
| 2021/0360824 A1* | 11/2021 | Franz | ........................ | G06F 1/20 |
| 2022/0120518 A1* | 4/2022 | Vanderwees | ............. | F28F 3/12 |
| 2022/0373275 A1* | 11/2022 | Mostafavi Yazdi | ...... | F28F 3/12 |
| 2023/0056832 A1* | 2/2023 | Tsai | .................... | F04D 29/4293 |

* cited by examiner

*Primary Examiner* — Jacob R Crum
*Assistant Examiner* — Matthew Sinclair Muir
(74) *Attorney, Agent, or Firm* — WOMBLE BOND DICKINSON (US) LLP

(57) ABSTRACT

A cooling plate for cooling high power density electronics has an internal cavity and an opening for fluid exchange with the cavity. A mounting structure is positioned within the opening. A coaxial port is attached to the mounting structure, the coaxial port having a center conduit and a ring conduit surrounding the central conduit such that rotational axis of the center conduit coincides with rotational axis of the ring conduit. A single coaxial port can serve to deliver cooling liquid to the cooling plate and return warmed fluid from the cooling plate. The coaxial port center conduit connected with a fluid distribution panel. Fluid distribution is regulated by the panel before it exits the port through the ring conduit.

16 Claims, 8 Drawing Sheets

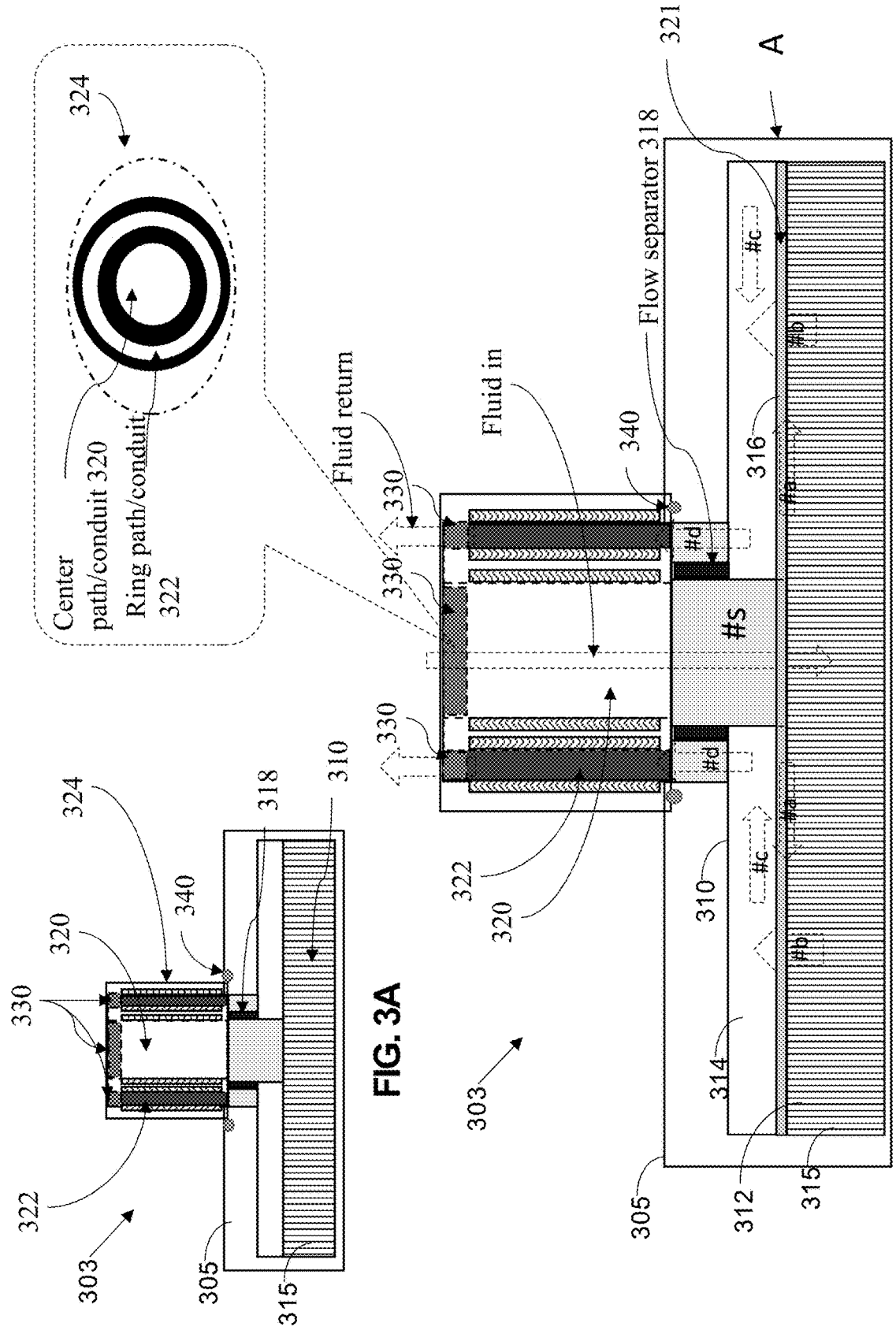

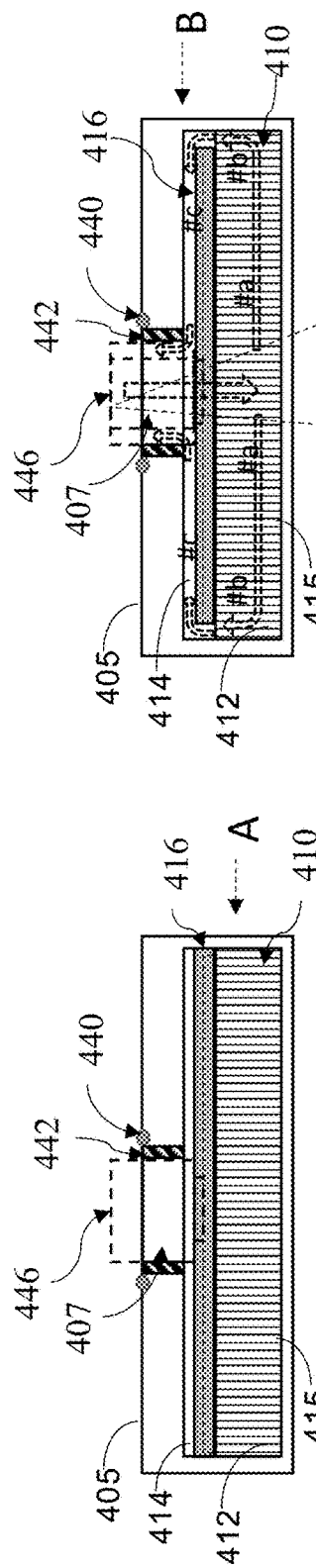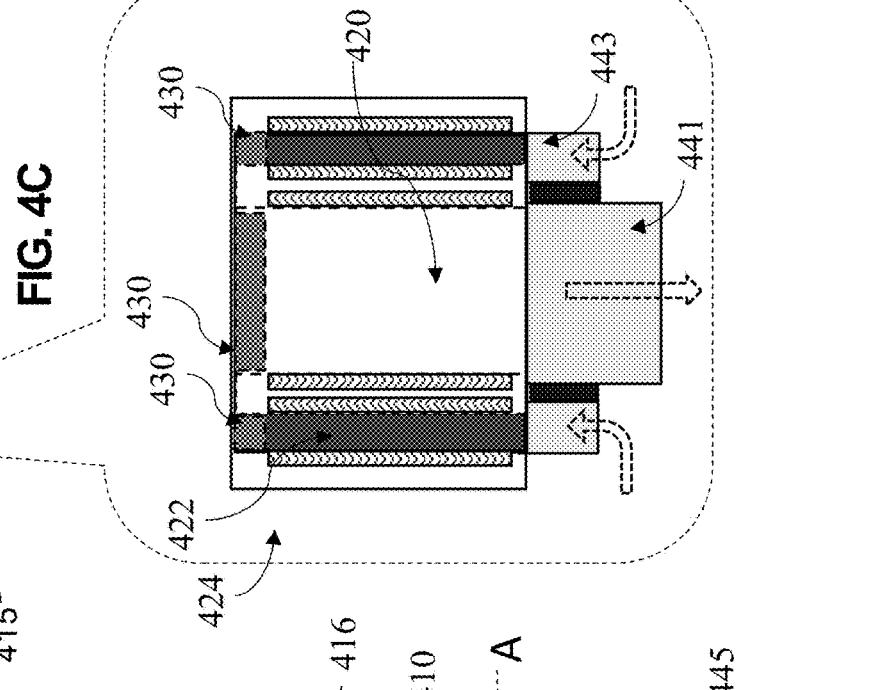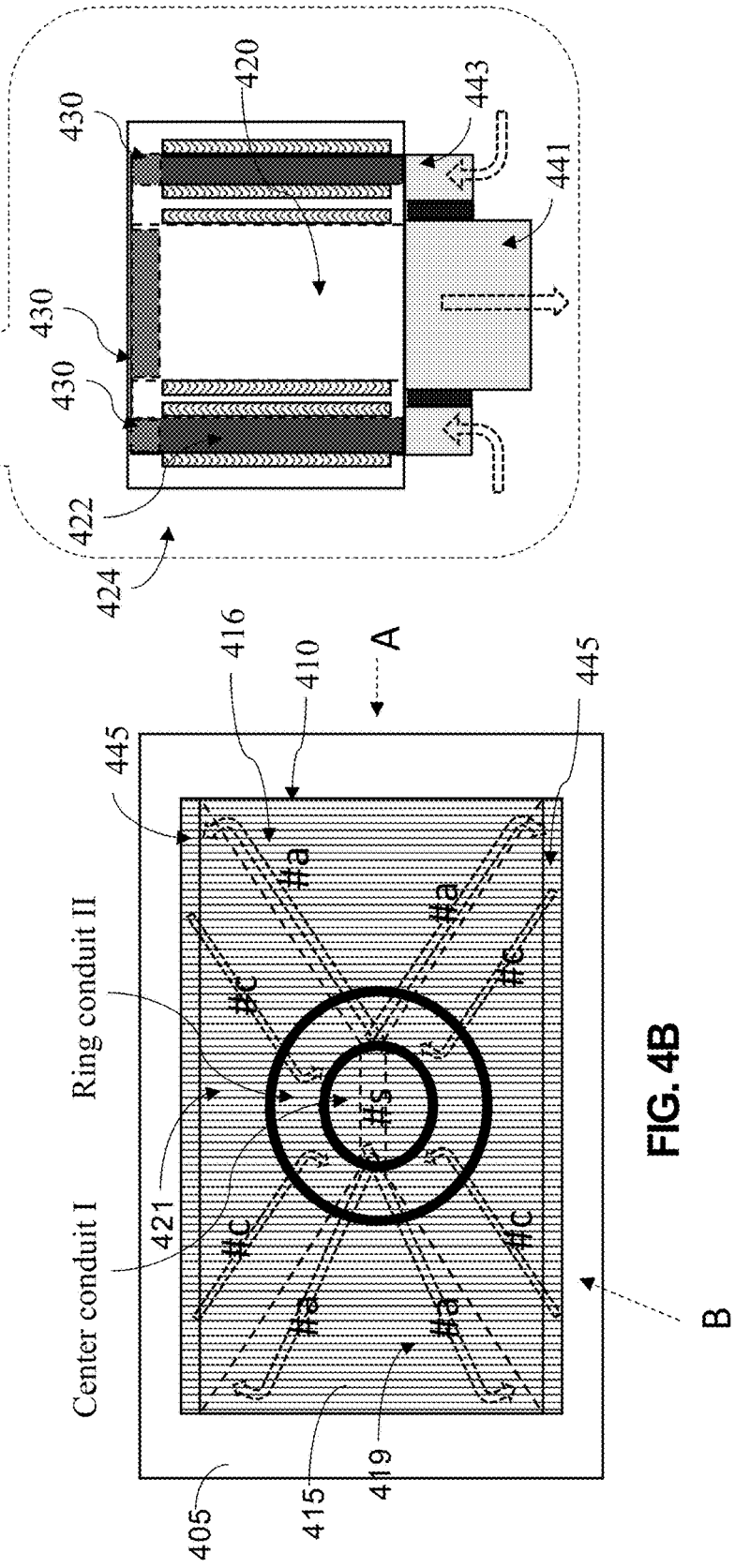

COOLING PLATE WITH COAXIAL FLUID PORT

FIELD OF THE INVENTION

Embodiments of the present invention relate generally to cooling of electronics such as processors and chips that require liquid cooling.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The proper operation of these processors is highly dependent on reliable removal of the heat they generate. Thus, proper cooling of the processors can provide high overall system reliability.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every effort needs to be taken to ensure proper heat removal from these chips. Moreover, the liquid cooling equipment must be highly reliable, since any irregularity in heat removal may lead to loss of the chips, causing loss of available computing power during the replacement operation, and even potential impact on the service level agreement which was handled by the lost chips. Importantly, existing solutions for cooling plate incorporate multiple ports, thus requiring additional area for the ports and hose connectors. This limits the chip density on the board. Conversely, current trend is to increase the number of devices on the board and increase the number of boards per unit area, both place stringent requirements on the size and form factor of the cooling arrangements. Moreover, each additional port presents additional possibility for a leak, thus impacting reliability.

While liquid cooling solution must provide the required thermal performance and reliability, since data centers may have thousands of chips requiring liquid cooling, the cost of the liquid cooling system must remain acceptable. The cost of liquid cooling per chip performance may be reduced if chip density can be increased and the liquid delivery system simplified. Additionally, since different chips have different cooling requirements, it would be desirable to provide a cooling design that is adaptable and expandable to fit different server architectures and be compatible with different chip packaging.

BRIEF DESCRIPTION OF THE DRAWINGS

Embodiments of the invention are illustrated by way of example and not limitation in the figures of the accompanying drawings in which like references indicate similar elements.

FIGS. 3A-3C illustrate an embodiment of a cold plate having coaxial port feature.

FIGS. 4A-4D illustrate an embodiment of a cold plate having coaxial port and distribution plate to control flow direction, wherein FIGS. 4A and 4C are side views, FIG. 4B is a top view, and FIG. 4D shows the design of the bottom surface of the distribution plate, according to an embodiment.

DETAILED DESCRIPTION

Figures 1, 2:
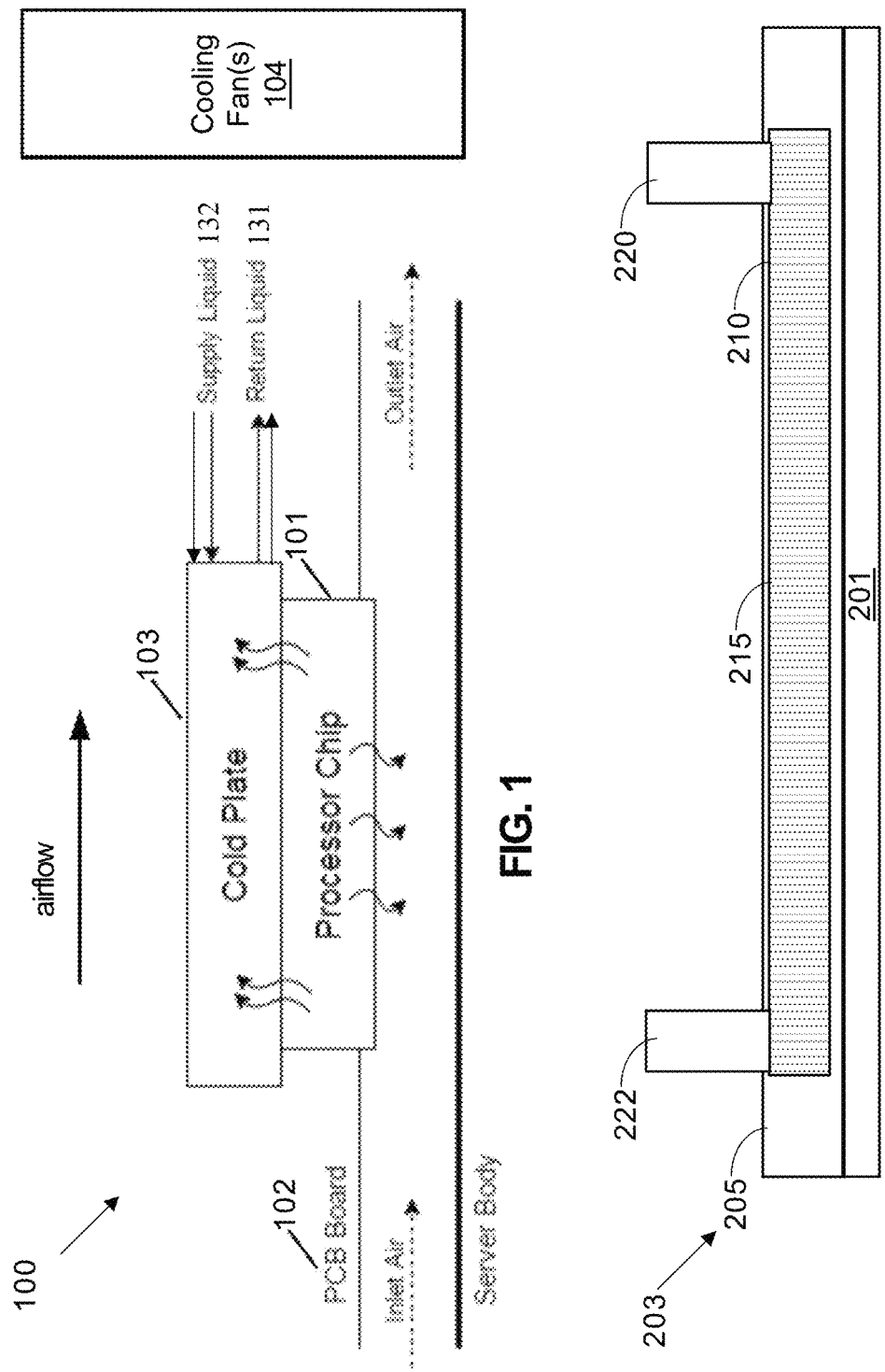
FIG. 1 is a block diagram illustrating an example of a cold plate configuration according to one embodiment.
FIG. 2 is a schematic illustrating a cross-section of a cooling plate according to prior art.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Incidentally, in the following embodiments similar elements are identified with similar reference numbers in the formal x ##, wherein the first digit x is replaced by the same digit as the figure number, while the next two digits ##are maintained consistent among the embodiments. Consequently, explanation of previously disclosed elements may not be repeated in subsequent embodiments.

Disclosed embodiments provide cooling plate for electronic devices, which utilizes coaxial ports to simplify the design and enhance the reliability of the cooling system. Additionally, the coaxial ports reduce the space required for the cooling plate, thus enabling higher chip density. By designing the cooling plate to have a single port, a more compact design can be provided, which enables packaging the electronic devices closer to each other to, among others, enable higher communication efficiency. Utilizing the coaxial ports also reduces the number of potential failure points and reduces the number of connectors. The cooling plate with coaxial ports may be implemented for cooling various electronic devices, such as single-chip module (SCM), system on a chip (SoC), multi-chip module (MCM), System in package (SIP), etc. For brevity, these are referred to herein as chips or simply chips, but any such reference should be understood to include any of these and similar variances of dies and packaging.

In various disclosed embodiments, the cooling plate includes fluid port that incorporate fluid supply and fluid return paths that are coaxial. The internal construction of the cooling plate may incorporate fins and baffles arranged to direct the fluid from the fluid inlet to the fluid outlet while maximizing heat transfer to the liquid. Thus, the fins and baffles may create a meandering path(s) for the liquid flow inside the cooling plate. Some embodiments may include more than one port, but at least one of the ports should be a coaxial port.

Additionally, the embodiments may incorporate leak detection sensors as a built-in feature. Since the port is coaxial, it presents only a single point of failure, so implementing leak detection can be limited to only that point of failure. Thus, the cost of implementing leak detection can be reduced.

FIG. 1 is a schematic diagram illustrating a chip cold plate configuration that may be implemented or modified according to embodiments disclosed herein. The chip/cold plate assembly 100 can represent any processors/cold plate structures of servers or other computing platforms incorporating fluid cooling. Referring to FIG. 1, chip 101 (e.g., an ASIC) is plugged onto a socket mounted on printed circuit board (PCB) or motherboard 102 coupled to other electrical components or circuits of a data processing system or server. For fluid cooling, chip 101 also includes a cold plate 103 attached to it, which is coupled to a rack manifold that is coupled to liquid supply line 132 and/or liquid return line 131, e.g., via blind mate connectors. A portion of the heat generated by chip 101 is removed by the cold plate 103. The remaining portion of the heat enters into an air space underneath or above, which may be removed by an airflow generated by cooling fan 104, when so equipped.

FIG. 2 is a side cross-section of a cooling plate assembly 203 according to the prior art. Cooling plate 203 may perform heat removal from the chip 201 by functioning as a heat sink. Cooling plate 203 is an example of a cooling plate that can directly benefit from embodiments of the coaxial fluid ports that incorporate multiple fluid passages disclosed herein.

Cooling plate 203 includes a core plate 205 made of thermally conductive material, such as copper or aluminum, etc. The bottom surface of the plate 205 is configured to be attached in physical contact with the chip packaging 201 for good thermal conductance. The interior of the plate has a cavity 210, which may include cooling fins 215. An inlet port 220 is used to supply cooling liquid into the cavity and a return port 222 is used to return the heated cooling liquid to the cooling system, as shown in FIG. 1. As can be appreciated, the requirement for two ports with the two connectors and two hoses requires much space and limits the geometry of the cooling plate 203.

Figure 3C:
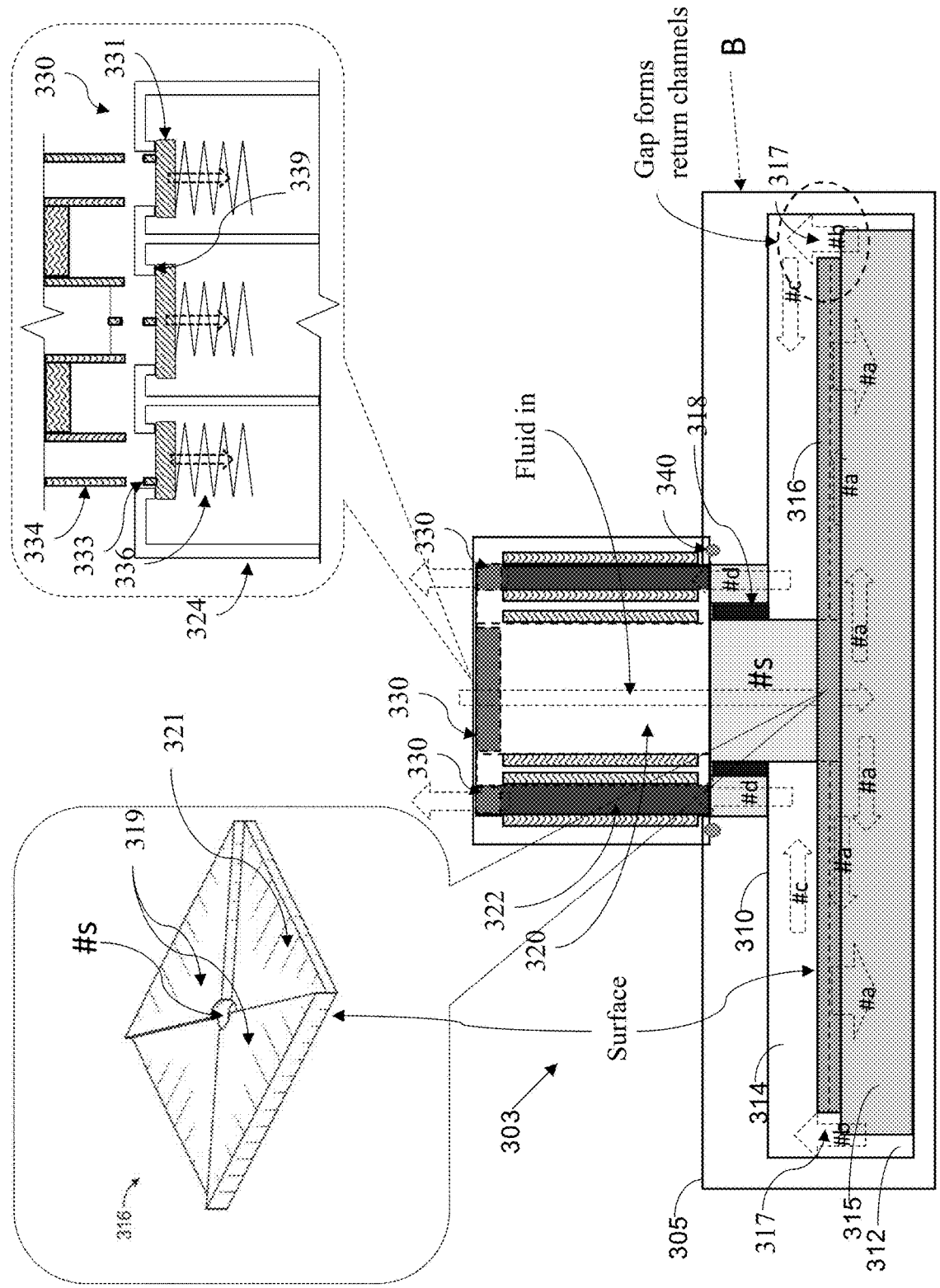

FIGS. 3A-3C illustrate an embodiment of a cooling plate having a single coaxial fluid port. Note that FIG. 3C represents the view taken from direction A in FIG. 3B. In the present disclosure, direction A and direction B may be defined based on the fluid fins 315 direction. Direction B is the longitudinal direction of all the fins 315, and direction A is the direction facing one side of one of the fins 315. Therefore, from direction B, all of the fins 315 and the channels formed by the fins are shown, while in direction A, only one of the fins is seen broadside. Similarly, the directions A and B can be defined by the sides of the return channels—in view from direction A the return channels 317 are visible on the left and right side (see FIG. 3C), while in direction B they are not visible as they are in positions in and out of the page.

Incidentally, since much of the discussion of the embodiments disclosed herein surrounds the coaxial port, the cooling plates are generally not drawn to scale, but instead shown rather small as compared to the port. In actual implementation the port may be much smaller compared to the plate, but for clarity the port is enlarge to show details. Also, while hatching is utilized to indicate the location of the fins, the hatching does not indicate the direction, orientation, size of number of fins, only the area where they are employed.

In this embodiment, the cooling plate 305 includes cavity 310 which incorporates cooling fins 315 functioning as flow restrictors to redirect the flow as needed. The cooling fins 315 are arranged to direct the circulating cooling fluid from the inlet, through the cavity 310, and out the outlet. Different fin designs can be employed to achieve this circulation, and some examples will be provided below. Alternatively, other flow restriction elements can be used to direct the flow of the fluid inside the cavity.

In this particular example, the cavity 310 is divided into lower chamber 312 and upper chamber 314 by a distribution plate 316. The fluid supplied from the port 324 enters one of the chambers (here bottom chamber 312), then flows to the other chamber (here upper chamber 314), and from there exits through the port 324, as illustrated by the arrows in FIG. 3B. Note that since the bottom chamber 312 is in contact with the bottom surface of the plate (which is the surface that contacts the chip) the cooling liquid should first flow to the bottom chamber to efficiently remove heat from the chip.

As illustrated in FIGS. 3A-3C, the cold plate 303 incorporates a single port, which serves both as a supply port and a return port. As illustrated by the callout in FIG. 3B, the supply port and return port are arranged coaxially, such that a central fluid passage 320 is located centrally within a second ring-shaped fluid passage 322. Depending on how the supply and return lines are connected, each passage may be used for supply or return. In the example of FIG. 3B the central passage is utilized as the supply port, while the exterior ring passage is used as the return port, as noted by the dashed-arrows indicating fluid flow. The dash-dot oval ring in the callout indicates that the conduits need not necessarily be circular. For example, in cases where it is desired to maintain polarity orientation of the connectors, the conduit may be oval, forcing the connector to be inserted in only one of two orientations.

In FIG. 3B, arrows in dash line represents the fluid streams. Incidentally, in the drawings, the arrows identified by #s represent the fluid supply, the arrows identified by #a represent the fluid spreading among the fins below the distribution plate 316 and may also indicate the spreading pattern within the distribution plate (in FIG. 3B #a is flowing in and out of the page), the arrows identified by #b represent the upward vertical streams moving from bottom chamber 312 to top chamber 314, via return channels 317 the arrows identified by #c represent the return flow above the distribution plate 316, the arrows identified by #d represent the return flow in the ring conduit. The view of FIG. 3C shows that return channel 317 of the distribution plate 316, forming a flow passage from the bottom chamber 312 to the top chamber 314, indicated by arrows #b. In the embodiment of FIGS. 3A-3C, the fluid streams identified as #b happen only at the edges of the fins, where the distribution plate 316 does not cover the fins. This is shown in FIG. 3C wherein #s represents the supply and #a represents the fluid streams across the distribution panel and the channels formed between the fin. The fluid spreads within the distribution panel and then flows into the return channels 317, as indicated by arrows #b seen only formed at the edge of the fins 315. Since in the width direction shown in FIG. 3C the distribution plate 316 is shorter than the length of the fins 315, a gap is formed which defines the return channels 317.

The dotted callout in FIG. 3C illustrates the distribution plate 316 flipped upside-down to show the details of the bottom surface of the distribution plate. The two triangular areas 319 are solid obstructions having the surfaces that contact the top of the fins when installed, and the two funnel shaped distribution channel cores 321 of the distribution panel. These surfaces correlate to surfaces 419 and 421 of FIG. 4B, discussed below.

FIGS. 3A-3C illustrate further features of this embodiment. One feature is the no-drip flap 330 which closes off the fluid passage when it is disconnected. The act of inserting the coupler automatically displaces the flap 330 to enable fluid to flow; however, when the coupler is removed, the flap springs back to block the passage and avoid drips. The callout of FIG. 3C provides one example for fabricating the no-drip flap 330. The callout is a truncated drawing of the top section of the coaxial port 324 and bottom part of a connector 334 (the other side of the connector 334 would be connected to, e.g., a hose or a pipe). The no-drip flap 330 is formed of a seal plate 331 (which would be disk shaped for the center conduit and ring shaped for the ring conduit) attached to a resilience element, such as a spring 336. The top surface of the seal plate includes engagement element, such as one or more dimples 333. In its non-engaged position of the no-drip flap 330, the resilience element urges the seal plates against a seal surface 339 of the coaxial port 324. However, when the connector 334 is inserted into the coaxial port 324 it pushed against the dimples so as to compress the resilience elements 336, as illustrated by the dotted arrows, thus pushing the seal plates away from the seal surface 339 and enabling fluid flow from the connector 334 to the coaxial port 324. When the connector is removed, the resilience elements 336 would again urge the sealing plates against the sealing surface 339 and prevent any drips. Resilient elements 336 maybe fixed onto the internal wall of the connector 324, which is not shown.

In this embodiment, the plate 305 itself is also modified to include a flow separator 318. The flow separator ensures that liquid entering from the coaxial port is directed properly to flow within the cavity 310 and not mix with the returning fluid. In this particular example, the flow separator 318 ensures that liquid delivered via the center conduit 326 flows into the bottom chamber 312 and cannot flow directly to the upper chamber 314, but rather flow through the distribution plate 316 and thence to the upper chamber 314. The flow separator 318 may be an integral part of the plate 305, it may be a separate part inserted into the opening in the plate 305 or onto the coaxial port connector, or it may be an integral part of the coaxial port connector. Regardless of the form of the flow separator 318, the design needs to ensure a good seal between the center conduit 326 and the top of the flow separator 318.

The embodiment of FIGS. 3A and 3C also includes a leak detection arrangement 340. The leak detection arrangement 340 integrates a leak detector at the connection surface between the plate 305 and the coaxial port 324. This is the place most susceptible to developing leaks, so placing the leak detector in this position would be most advantageous. In one embodiment the leak detection is integrated inside of the plate 305 and being sandwiched between the plate 305 top surface and bottom surface of the coaxial connector 324. This ensures that the leak detection sensor identify the leaking of the fluid before the fluid leaks out from the connection interface.

Thus, an arrangement for a cooling plate is provided, wherein a single coaxial port enables supply of cooling fluid and return of warmed fluid. The plate incorporates a cavity having flow directing fins that forms a pathway from an inlet to an outlet; The coaxial port incorporates a central fluid conduit and a ring fluid conduit, wherein the axis of revolution of the central conduit and the axis of revolution of the ring conduit coincide.

Figure 4D:
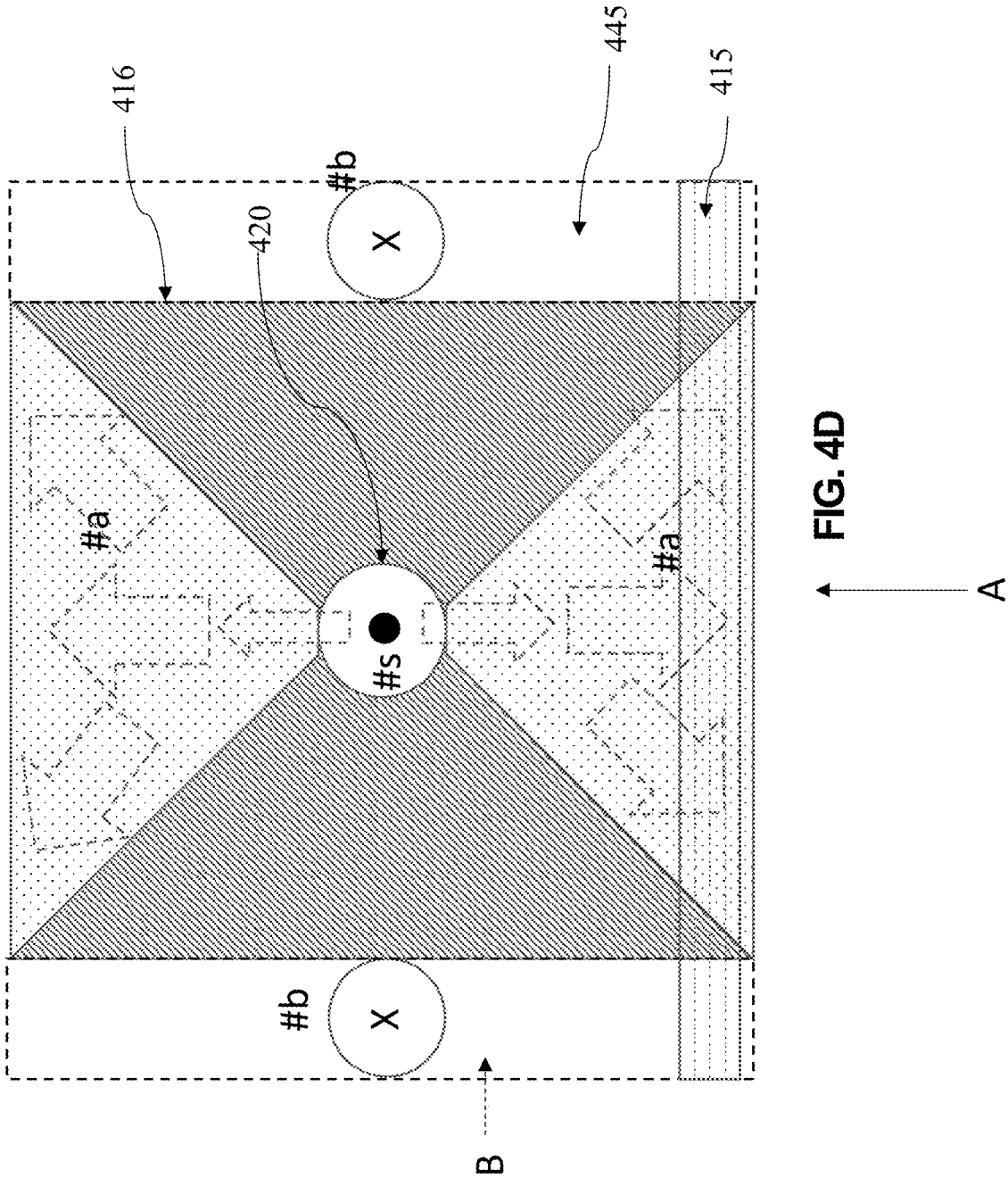

FIG. 4A illustrates a cross section of a cooling plate 405 fabricated to accept a coaxial port, while FIG. 4B is a top view thereof indicating fins and flow design and FIG. 4C is a view from direction A identified in FIGS. 4A and 4B. The coaxial port may be fabricated integrally to the plate, or the plate may be fabricated separately and formed to accept a coaxial port connector. The embodiment of FIGS. 4A-4D illustrate the design wherein the plate is fabricated to accept a coaxial port connector 446, e.g., by thread, tight-fit, weld, etc. In this example, a mounting structure 442 is provided within opening 407 to accept and secure the coaxial port connector 446. The leak detector 440 is provided around or inside the mounting structure 442, as it forms the spot most vulnerable to spring a leak.

An example of a coaxial port connector 424 is illustrated in the callout of FIG. 4C. The coaxial connector 424 shown in the callout is inserted into the mounting structure 442 to form a sealed connection there-between. Any method for securing the coaxial connector 424 to the mounting structure 442, such as threaded connection may be used, as long as it forms a leak-proof seal. In one example, the coaxial connector has a central insert 441 that ensures fluid is delivered directly to the bottom chamber 412, and a ring insert 443 to receive fluid from the top chamber 414 (illustrated by the dotted arrows). The no-drip flap 430 is implemented similar to that of FIG. 3C.

The design of the fluid cavity 410 of this embodiment can be understood by reference to FIGS. 4A-4C. When the coaxial port connector 446 is inserted into the opening 407 and secured to the mounting structure 442, two separate fluid conduits are formed: central fluid conduit I and ring fluid conduit II. Setting the central conduit as the inlet, the supplied cooling liquid is forced to first flow to the bottom cavity 412, which is below the distribution panel 416 (see dotted arrows). The distribution panel incorporates or is attached to fins 415 by the two opposing triangles (see 319 in FIG. 3C) to form a funnel 419, shown by the dashed lines indicating two triangular shaped funnels. This forces the cooling liquid to flow towards two opposing edges of the cavity 410. When the liquid reaches the two edges, it has collected heat from the chip in contact with the cooling plate 405, and enters return channels 445. The return channels 445 define fluid passage from the bottom cavity 412 to the upper cavity 414. From there the fluid flows into the ring conduit II and exits the cooling plate. Importantly, this is but one example for forming a flow path inside the cavity 410 and other paths can be design so as to maximize heat removal and ensure separation of flow between central conduit I and ring conduit II.

FIG. 4D illustrates an example of the distribution plate 416 viewed from below, which is either attached to the top of the fins or is fabricated with integral fins. FIG. 4D shows just a section of the fins for illustration purpose. It is seen that partial of the fin are not covered by the distribution panel. The dotted area indicates the funnel design of the bottom surface of the distribution plate, which is optimally designed to distribute the cooling liquid received from the center conduit 420. The supplied fluid is indicated as #s and the dotted showing that flow direction is out of the page. The fluid distributed by the funnel design of the distribution plate is shown as arrows marked #a. It needs to be mentioned that some of the fluid stream #a is flowing outside of the page to fill the fin channels, which is not shown in this view. The hatched area indicates the funnel design of the top surface of the distribution plate which is optimally designed to collect fluid flowing via the return channels 445 and deliver the fluid to the ring conduit. The flow through the return channel is indicated as #b and shown by circled-x to indicate flow direction into the page. The return flow over the dashed area and the ring conduit are obscured from view from the bottom. Note that in this example the return channels are shown in dashed lines since they are formed by having the distribution plate shorter than the cavity, thus not reaching to the sidewall of the channel and leaving space for fluid to flow. Of course, other designs of the distribution plate can be employed to optimize for different cooling requirements and cooling fluids.

Figure 5:
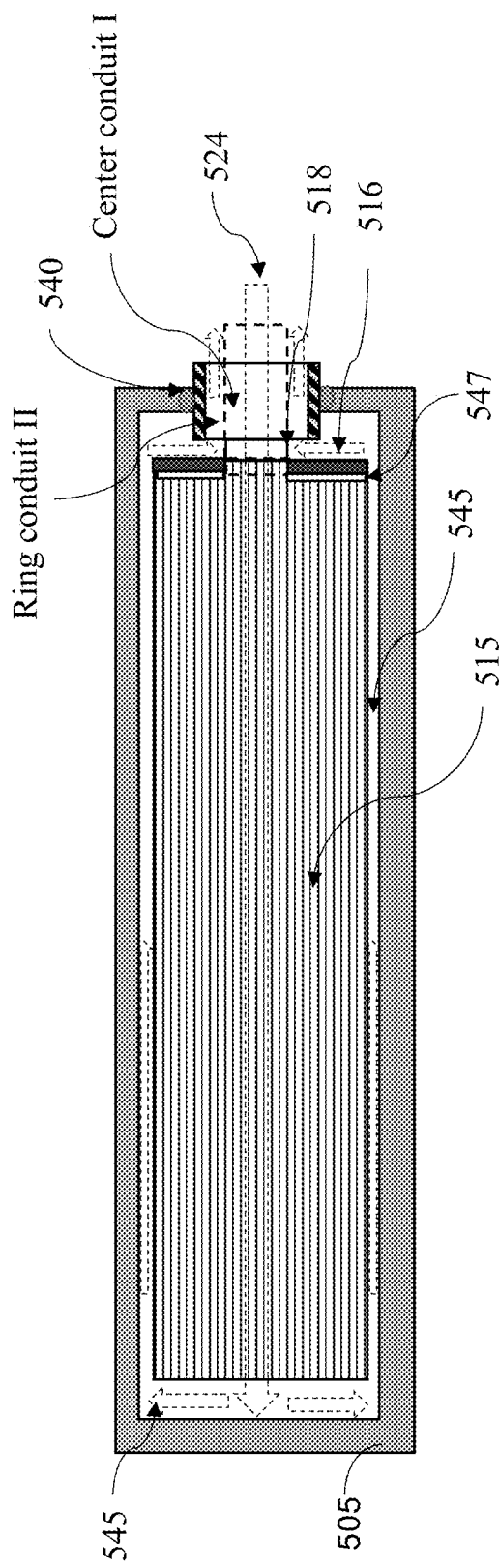
FIG. 5 is a transparent view illustrating an embodiment of a cold plate having coaxial port on the sidewall.

One advantage of using a coaxial port is the ability to place the coaxial port on the side of the cooling plate. An example of such an arrangement is illustrated in FIG. 5, wherein the coaxial port 524 is provided on the side of cooling plate 505, thus, e.g., enabling the server board to assume a thinner profile to increase server boards density. More than one coaxial ports can be mounted onto the sidewall, except that in some embodiments they will be aligned in a row extending into the page, thus obscured from view by the first port shown in FIG. 5. The flow separator 518 ensures flow separation between the center conduit I and ring conduit II of the coaxial port. As illustrated by the dashed arrows, when the center conduit is used as the inlet conduit, delivered liquid follows the path defined by the distribution plate 516, through the distribution area 547 to the channels defined by the fins 515, to remove heat from the chip. It then flows to the return channels 545 and thence to the ring conduit II to return to the liquid cooling system (FIG. 1).

Figure 6:
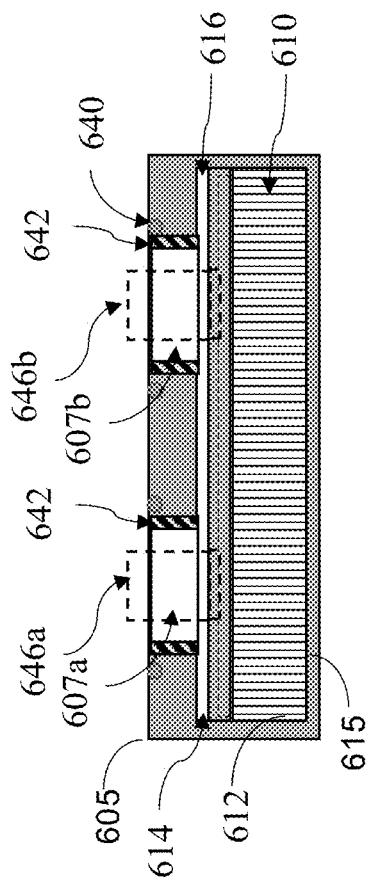
FIG. 6 illustrates an embodiment of a cooling plate having multiple coaxial ports.

For advanced processing chips it may be required to increase heat removal by increasing the amount of cooling fluid circulating within the cooling plate. Also, at times the cooling plate may require two separate cooling fluids, either as redundancy or using two different types of cooling fluid having different performance characteristics. FIG. 6 illustrates an example of a cooling plate having multiple (here, two) coaxial ports, that can be used in such circumstances. The cooling plate 605 is shown having a first opening 607a and a second opening 607b, for accepting the coaxial connectors 646a and 646b, respectively. In some designs the fluid from each of the coaxial connectors 646a and 646b can follow an independent path within the cavity 610 of the cooling plate 605. In the illustrated example the fluid from both coaxial ports 646a and 646b flow to the bottom chamber 612, then passes through a return channel 645 (not visible in this orientation) to the upper chamber 614.

Figure 7:
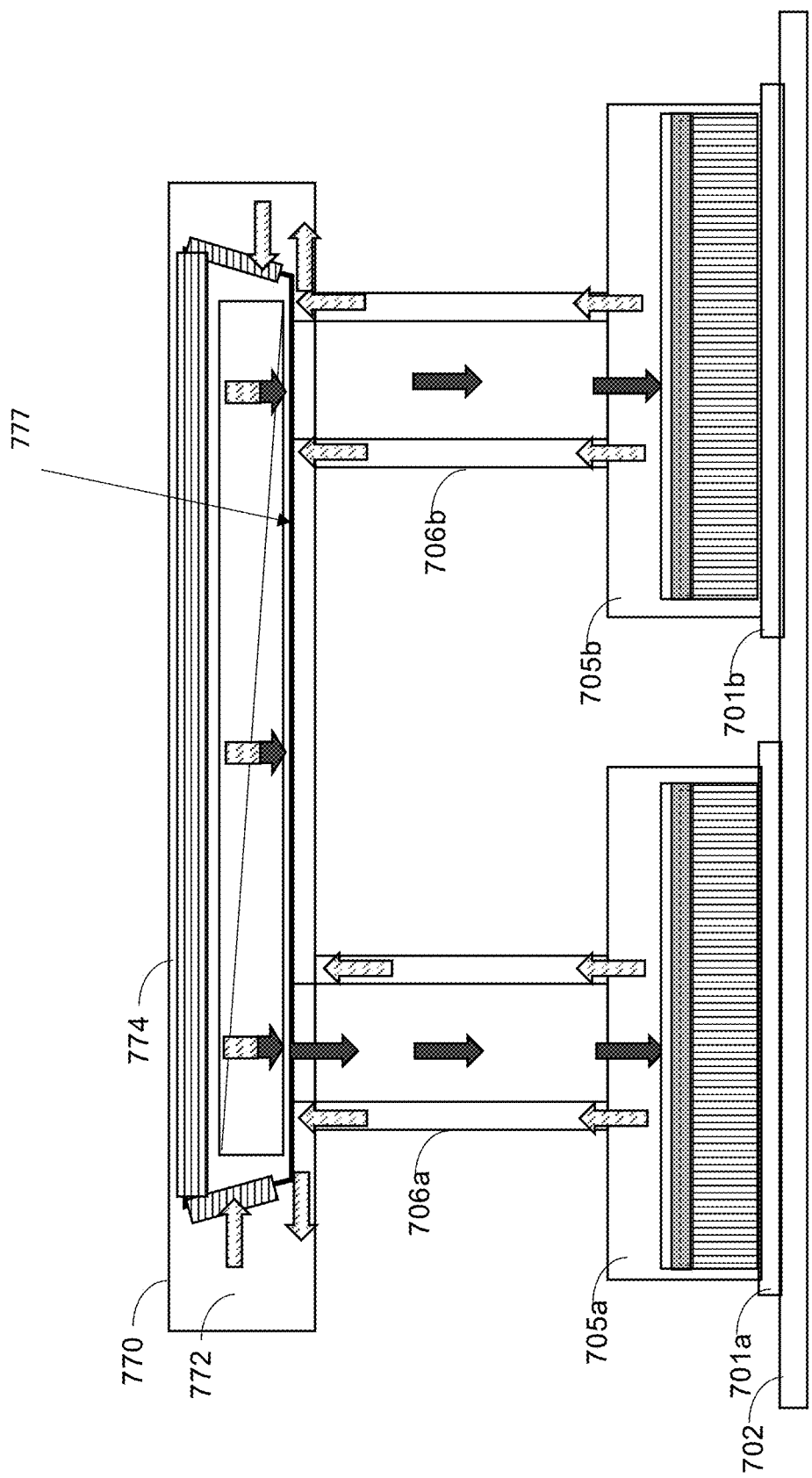
FIG. 7 is a side view schematic illustrating cooling plates coupled to vapor condenser to incorporate two-phase liquid cooling, according to an embodiment.

FIG. 7 illustrates an arrangement wherein the coaxial ports are integrated into a self-contained two-phase cooling system. As illustrated, two chips 701a and 701b are mounted onto the electronics board 702. Cooling plates 705a and 705b are attached to each of the chips 701a and 701b, and each plate has a coaxial port which leads via coaxial conduits 706a and 706b to condensing unit 770. Condensing unit 770 includes vapor chamber 772 and condenser 774. In FIG. 7, solid arrow indicates liquid while hatched arrows indicate vapor. This example is beneficially arranged vertically such that the condensing unit 770 is positioned directly above the cooling plates 705a and 705b, thus relying on gravity rather than mechanical pumps to supply motive force to the cooling liquid.

As illustrated by the arrows, when liquid within the cooling plates vaporizes, it rises and flows through the ring conduit to the condensing unit 770. When the vapor contacts the condenser 774 it changes phase to liquid, thus transferring its heat to the condenser unit 770. The condensed liquid then drips onto collector 777, which collects the condensed liquid and deliver it to the center conduit back into the cooling cavities of the cooling plates 705a and 705b. Thus, the heat generated by the chips 701a and 701b is transferred to the vapor as it vaporizes the cooling liquid. The rising vapor transport the heat out of the cooling plates and into the condenser. The condenser then transfers the removed heat to the atmosphere via the cooling system (FIG. 1).

Figure 8:
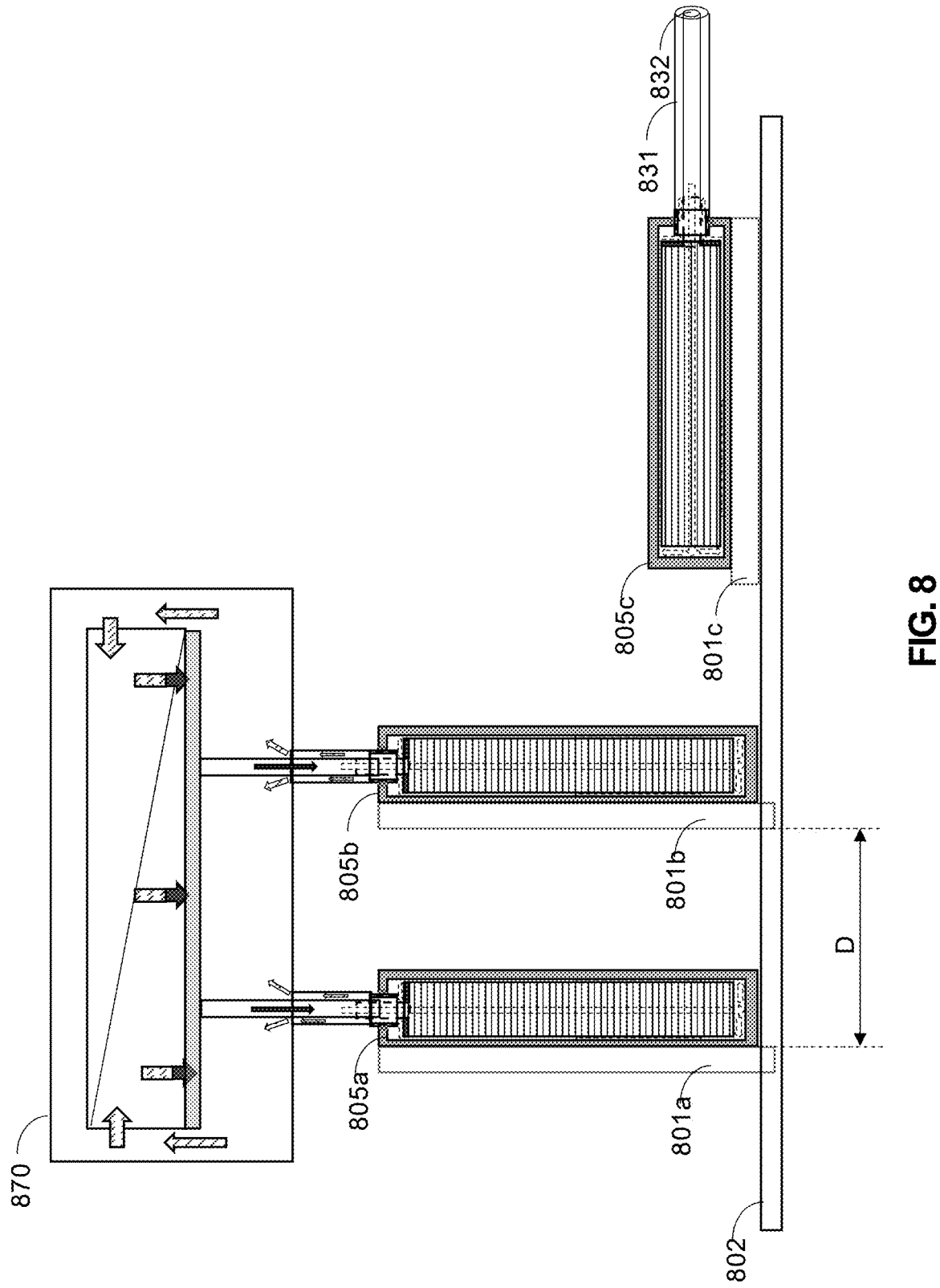
FIG. 8 is a schematic illustrating cooling plates of different configurations mounted onto the same electronics board, according to an embodiment.

FIG. 8 illustrates an example of using the coaxial port cooling plates to increase chip density on a PCB. Here, three ships 801a, 801b and 801c are mounted on PCB 802, although as can be appreciated many more chips can be mounted onto the PCB and served by the liquid cooling system. In this illustration, dashed arrows indicate flow direction (either liquid or vapor), solid arrow indicate liquid, and hatched arrows indicate vapor. This embodiment includes both liquid cooling and two-phase cooling for the same PCB. In this particular example, cooling plates 805a and 805b operate with phase change liquid, while cooling plate 805c operates with single-phase cooling liquid. Thus, condenser unit 870 serves to condense vapor received from plates 805a and 805b, while a liquid cooling system (FIG. 1) is used to cool the liquid returned from plate 805c.

This example also shows the benefit of enabling to place the coaxial ports on the side, rather than the top surface of the cooling plate. Here, to increase packing density, chips 801a and 801b are mounted vertically. Therefore, a prior art cooling plate having two ports on the top plate (FIG. 2) would require a relatively large spacing D between the chips to accommodate the ports, the connectors, and the hoses. Conversely, since the coaxial port can be fabricated on the side of the cooling plates, the spacing D can be minimized, thus increasing chip density.

Thus, a two phase cooling arrangement is provided, wherein a cooling plate incorporates a coaxial port with a ring fluid conduit and a central fluid conduit coaxially positioned within the ring fluid conduit. The central conduit forms a passage for cooling liquid delivery to the cooling plate, while the ring conduit forms fluid passage for removal of vapor from the cooling plate. The vapor is delivered to a condenser unit and condensed liquid is returned to the cooling plate via the central conduit. The condenser unit is positioned above the cooling plate, such that condensed liquid is returned to the cooling plate via gravity.

Thus, according to disclosed embodiments, a server board is provided wherein a chip is mounted on a PCB and a cooling plate is attached to the chip. The cooling plate incorporates coaxial port having a ring fluid conduit and a central fluid conduit coaxially positioned within the ring fluid conduit. The cooling plate has an internal fluid cavity and a distribution plate is positioned inside the fluid cavity to direct the fluid flow. Cooling fins can be formed on or attached to the distribution plate to direct the flow of the cooling fluid. A flow separator positioned at the coaxial port ensures separation of the flow between the central conduit and the ring conduit. Leak detector may also be provided at the coaxial conduit. In some embodiments the central conduit is used to deliver cooling liquid, while the ring conduit is used to return heated liquid or vapor.

According to further disclosed aspects, method for fabricating a cooling plate for chip is provided, comprising forming an internal cavity inside a plate made of a thermally conductive material; fabricating a distribution plate within the cavity; forming a passage to the cavity; attaching to the passage a coaxial port by having a ring conduit and a central conduit positioned centrally within the ring conduit. The method may further include attaching a leak detector to the coaxial port. Also, the distribution plate may include fins arranged to direct the fluid flow and channels to return the fluid to the ring conduit.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A liquid cooling arrangement, comprising:
   a chip;
   a cooling plate physically attached to the chip, the cooling plate having an internal cavity and an opening for fluid exchange with the cavity, a mounting structure is positioned within the opening;
   a coaxial port attached to the mounting structure, the coaxial port having a center conduit and a ring conduit surrounding the center conduit such that rotational axis of the center conduit coincides with rotational axis of the ring conduit; and
   a distribution plate positioned inside the cavity, the distribution plate comprising a top surface and a bottom surface, wherein the bottom surface includes a spreading pattern to distribute a cooling fluid received from the center conduit and the top surface of the distribution plate includes a funnel shape configured to deliver the cooling fluid from the cavity to the ring conduit.

2. The cooling arrangement of claim 1, further comprising heat spreader inside the cavity.

3. The cooling arrangement of claim 1, wherein the cooling plate comprises a bottom surface configured for attachment to the chip, a top surface, and a sidewall, and wherein the distribution plate divides the cavity into a first chamber contacting the bottom surface and a second chamber contacting the top surface.

4. The cooling arrangement of claim 3, further comprising a flow distributor forming a first fluid passage from the center conduit to the first chamber and a second fluid passage from the second chamber to the ring conduit.

5. The cooling arrangement of claim 3, further comprising a leak detector positioned and sandwiched at a contacting interface between the mounting structure and the coaxial port.

6. The cooling arrangement of claim 3, wherein the distribution plate comprises channels forming a flow passage from the first chamber to the second chamber.

7. The cooling arrangement of claim 1, further comprising a no-drip flap configured to seal the coaxial port when no fluid coupler is connected.

8. The cooling arrangement of claim 1, wherein the ring conduit is non-circular.

9. The cooling arrangement of claim 1, further comprising a condenser unit and coaxial conduit connected at one end to the coaxial port and at a second end to the condenser unit, wherein the coaxial conduit has one channel connected to a liquid region of the condenser and a second channel connected to a vapor region of the condenser.

10. A server arrangement comprising:
    a printed circuit board (PCB);
    a plurality of chips mounted on the PCB;
    a plurality of cooling plates, each mounted onto one of the chips;
    wherein each of the cooling plates comprises an internal cavity and an opening for fluid exchange with the cavity, a mounting structure is positioned within the opening; and
    a coaxial port attached to the mounting structure, the coaxial port having a center conduit and a ring conduit surrounding the center conduit such that rotational axis of the center conduit coincides with rotational axis of the ring conduit;
    wherein a distribution plate is positioned inside at least one of the internal cavities of the plurality of cooling plates, the distribution plate comprising a top surface and a bottom surface, wherein the bottom surface includes a spreading pattern to distribute a cooling fluid received from the center conduit and the top surface includes a funnel shape configured to deliver the cooling fluid from the cavity to the ring conduit.

11. The server arrangement of claim 10, further comprising condenser unit fluidly coupled to at least one of the cooling plates and a coaxial fluid line coupled between the coaxial port and the condenser unit.

12. The cooling arrangement of claim 1, wherein the spreading pattern comprises a recessed surface in the bottom surface of the distribution plate.

13. The cooling arrangement of claim 12, wherein the recessed surface in the bottom surface of the distribution plate comprises two opposing triangular shaped recesses.

14. The cooling arrangement of claim 1, wherein the spreading pattern comprises a funnel shaped distribution channel core.

15. The server arrangement of claim 10, wherein the spreading pattern comprises a recessed surface in the bottom surface of the distribution plate.

16. The cooling arrangement of claim 15, wherein the recessed surface in the bottom surface of the distribution plate comprises two opposing triangular shaped recesses.

* * * * *